United States Patent [19]

Zweifel et al.

[11] 4,377,669
[45] Mar. 22, 1983

[54] PHOTOCROSSLINKABLE POLYESTER WITH SIDE TRICYCLIC IMIDYL GROUPS

[75] Inventors: Hans Zweifel, Basel; Daniel Bellus, Riehen, both of Switzerland

[73] Assignee: Ciba-Geigy Corporation, Ardsley, N.Y.

[21] Appl. No.: 241,194

[22] Filed: Mar. 6, 1981

Related U.S. Application Data

[62] Division of Ser. No. 9,984, Feb. 6, 1979, Pat. No. 4,283,509.

[30] Foreign Application Priority Data

Feb. 8, 1978 [CH] Switzerland ............... 1401/78

[51] Int. Cl.³ .............................................. C08G 63/46
[52] U.S. Cl. .................................... 525/445; 525/436; 528/289; 528/296; 528/297; 528/298; 528/365
[58] Field of Search ............... 525/445, 425, 426, 436; 528/289, 365, 296, 297, 298

[56] References Cited

U.S. PATENT DOCUMENTS

| | | | |
|---|---|---|---|
| 3,652,716 | 3/1972 | Holub et al. | 260/860 |
| 3,721,580 | 3/1973 | Trott et al. | 117/118 |
| 3,729,446 | 4/1973 | Holub et al. | 260/47 CZ |
| 3,763,271 | 10/1973 | Klebe et al. | 260/78 UA |
| 3,766,294 | 10/1973 | Klebe et al. | 260/78 UA |
| 3,773,718 | 11/1973 | Klebe et al. | 260/47 ET |
| 3,920,618 | 11/1975 | Ichimura et al. | 260/78 UA |
| 4,107,174 | 8/1978 | Baumann et al. | 260/326 NS |
| 4,283,509 | 8/1981 | Zweifel et al. | 525/375 |

FOREIGN PATENT DOCUMENTS

| | | |
|---|---|---|
| 49-128991 | 12/1974 | Japan . |
| 49-128992 | 12/1974 | Japan . |
| 49-128993 | 12/1974 | Japan . |
| 50-5376 | 1/1975 | Japan . |
| 50-5377 | 1/1975 | Japan . |
| 50-5378 | 1/1975 | Japan . |
| 50-5379 | 1/1975 | Japan . |
| 50-9682 | 1/1975 | Japan . |
| 50-10884 | 2/1975 | Japan . |

OTHER PUBLICATIONS

CA, 65, 12148g (1966) (=Japan 9184/66).

Primary Examiner—Harold D. Anderson
Attorney, Agent, or Firm—Luther A. R. Hall

[57] ABSTRACT

Photo-crosslinkable, novel polymers with side tricyclic imidyl groups, for example those of the formula

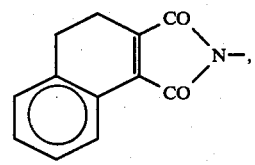

are described. The novel photo-crosslinkable polymers are suitable for photo-mechanical applications, for example for the production of printing plates for the offset printing process and especially as photo-resists. They have high UV absorption and ensure a high rate of crosslinking even without the addition of photosensitizers.

5 Claims, No Drawings

PHOTOCROSSLINKABLE POLYESTER WITH SIDE TRICYCLIC IMIDYL GROUPS

This is a divisional of application Ser. No. 009,984, filed on Feb. 6, 1979, now U.S. Pat. No. 4,283,509, issued on Aug. 11, 1981.

The present invention relates to novel photocrosslinkable polymers with side tricyclic imidyl groups, processes for their preparation and their use for photocrosslinking, especially to produce images.

It is known from the literature that diversely substituted imides, in particular maleimides, are suitable for the preparation of crosslinkable (curable) polymers. Japanese Published Specifications 50-5376, 50-5377, 50-5378, 50-5379 and 50-5380 describe generically different α-arylmaleimides and N-substituted derivatives thereof which are suitable for the preparation of photocrosslinkable polymers; the said derivatives can be further substituted in the β-position by a halogen atom, a cyano group or a lower alkyl group and the said alkyl group can also form a ring together with the C atom in the ortho-position of the α-aryl group. The specific disclosure is restricted, however, to α-phenylmaleimides and α-phenyl-β-cyano-maleimides and N-substituted derivatives thereof. In Japanese Published Specifications 49-128,991, 49-128,992, 49-128,993, 50-9682, 50-10,884 and 50-77,363 the preparation of photo-crosslinkable polymers is described, for example by reacting N-substituted α-arylmaleimides of the abovementioned type, which have hydroxyl, amino, carboxylic acid or carboxylic acid chloride groups on the N-substituent, with polymers containing corresponding functional groups. Further imidyl derivatives and photo-crosslinkable polymers containing imidyl groups in end or side positions, especially maleimide, dimthylmaleimide, nadicimide and tetrahydrophthalimide groups, are known from German Offenlegungsschriften 2,031,573, 2,032,037 and 2,626,795.

These previously known imides and the crosslinkable polymers which can be prepared therefrom have the disadvantage of a relatively low photochemical sensitivity and for this reason they are not suitable, or not very suitable, for numerous applications for which highly photosensitive substances are required, or they require the additional use of known photosensitisers, such as benzophenone, thioxanthone and the like.

The object of the invention was, therefore, to provide novel photo-crosslinkable polymers which have a high UV absorption and, because of this, also ensure a high rate of crosslinking even without the addition of photosensitisers.

The invention relates to novel photo-crosslinkable polymers which have an average molecular weight of at least 1,000 and have side imidyl groups of the formula I

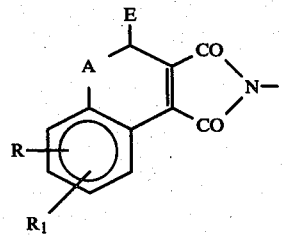

in which A is —CH$_2$—, —CH$_2$CH$_2$— or —OCH$_2$— with the oxygen atom bonded to the aromatic ring and E is hydrogen, or A is —O— and E is —CH$_3$, and R and R$_1$ independently of one another are hydrogen, halogen, alkyl having 1-4 C atoms or methoxy, the proportion of imidyl groups of the formula I being at least 5 percent, preferably 5-100 and in particular 20-100 percent, based on the number of recurring structural elements in the polymer.

The polymers according to the invention advantageously have an average molecular weight of at least 1,000 to 1,000,000 and in particular an average molecular weight of about 1,000 to 200,000.

The polymers according to the invention are, for example, polyesters, polyester-amides, polyamides, polyimides, polyamide-imides, polyester-amide-imides, polyethers, polyamines, polyimines, polyurethanes, polycondensation products based on phenol-formaldehyde, polysaccharides, gelatin, organopolysiloxanes and polymers which are obtained by homopolymerisation or copolymerisation of monomers containing C=C double bonds.

The polymers according to the invention can be prepared by synthesis methods known per se for the preparation of macromolecules with photoactive side groups. In principle, the following routes can be used:
1. Incorporation of the tricyclic imidyl groups of the formula I into an existing polymer chain; and
2. Build-up of the polymer chain from monomers which already contain the photosensitive tricyclic imidyl group, in which case the polymer chain can be built up by polymerisation, polyaddition or polycondensation.

In some cases, the same products can be obtained with methods 1 and 2, so that method 1 or method 2 can be used as desired. If the tricyclic imidyl groups are incorporated into an existing polymer chain, this incorporation is effected either by a condensation reaction or by an addition reaction with simultaneous opening of a ring system, for example of a dicarboxylic acid anhydride group or of an epoxide group.

According to the abovementioned build-up method, polymers according to the invention can be prepared by polymerizing a compound of the formula II

in which "imidyl" is a radical of the formula I, n is the number 1 or 2 and Y is alkylene having 1-30 C atoms, which can be interrupted by hetero-atoms, or is cycloalkylene having 5 or 6 C atoms, a dicyclohexylmethane radical, arylene having 6-10 C atoms, or aralkylene or alkylarylene having 7 or 8 C atoms, it being possible for the said radicals Y also to be substituted, and X, when n=1, is a group of the formulae —NH—CO-alkenyl or

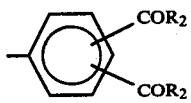

and, when n=2, is —CO—O-alkenyl, —O-alkenyl, —O—CO-alkenyl, —NH—CO-alkenyl or —S—CO-alkenyl, the —COR₂s are bonded to the benzene ring in the meta- or para-position relative to one another and the R₂s are each —OH, —Cl, alkoxy having 1–4 C atoms or phenoxy, or the —COR₂s are bonded to the benzene ring in the ortho-position relative to one another and one of the R₂s is —OH or —O⁻M⁺ and the other is

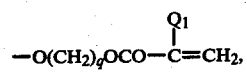

or the two R₂s together are —O—, and M⁺ is an alkali metal cation, the pyridinium cation or a trialkylammonium cation having 3–24 and especially 3–12 C atoms, Q₁ is hydrogen or methyl and q is an integer from 2 to 4, and, in the above groups, alkenyl moieties have 2–4 C atoms, if desired in the presence of comonomers, the molar ratio of the compound of the formula II to the comonomer being 1:20 to 1:10 and preferably 1:4 to 1:0.

According to the abovementioned incorporation method, polymers according to the invention can be prepared, for example, by reacting a compound of the formula III

 (III)

in which "imidyl" is a radical of the formula I, n and Y are as defined under formula I and X', when n=1, is a group of the formula

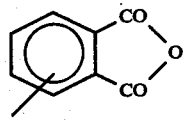

and, when n=2, is —OH, —NH₂, —NH-alkyl having 1–4 C atoms, —SH, —COOH or —COCl, with a polymer containing corresponding functional groups in a ratio of 1:20 to 1:1 and preferably 1:5 to 1:1, based on the number of recurring structural elements in the polymer.

Compounds of the formula III in which X' is —COOH, —COCl or a phthalic anhydride group can, for example, be reacted with polymers which contain free —OH, —NH₂, —NH-alkyl or —SH groups. Compounds of the formula III in which n is the number 2 and X' is —OH, —NH₂, —NH-alkyl having 1–4 C atoms or —SH are suitable, for example, for reaction with polymers which contain —COOH or anhydride groups. Finally, compounds of the formula III in which n is the number 2 and X' is —OH, —NH₂, —NH-alkyl having 1–4 C atoms, —SH or —COOH can also be reacted with polymers which contain

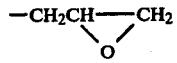

groups.

Alkylene, cycloalkylene, dicyclohexylmethane, arylene, aralkylene or alkylarylene groups Y, according to the definition, can be unsubstituted or substituted, for example by alkyl or alkoxy groups each having 1–4 C atoms and in particular each having 1 or 2 C atoms, nitro groups or halogen atoms, such as chlorine, bromine or fluorine.

Alkylene groups Y can be straight-chain or branched and can contain one or more hetero-atoms, especially S or O atoms. Unsubstituted, straight-chain or branched alkylene groups are preferred, especially those having 2–10 C atoms. Examples of suitable alkylene groups Y are the ethylene group, the 1,3- or iso-propylene group, the 2,2-dimethylpropylene group, the tetramethylene group, the hexamethylene group, the octamethylene group and the decamethylene group.

A cycloalkylene group Y is preferably unsubstituted. It is especially the 1,3-cyclohexylene group and in particular the 1,4-cyclohexylene group.

Substituted arylene groups Y preferably have only one substituent per ring and this substituent is in particular an alkyl or alkoxy group, each having 1–4 and in particular 1 or 2 C atoms, or a nitro group. Examples of suitable arylene groups Y are the 1,2-, 1,3- and 1,4-phenylene group, the 1,3-tolylene group, the 5-methoxy-1,3-phenylene group, the 3-nitro-1,4-phenylene group and the 1,7- or 2,7-naphthylene group. Unsubstituted arylene groups are preferred, especially the 1,4-phenylene group and the 1,3-phenylene group.

Aralkylene groups Y are, in particular, the groups

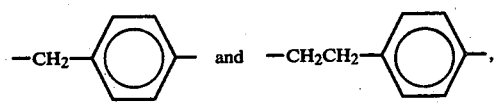

and alkylarylene groups Y are, in particular, the groups

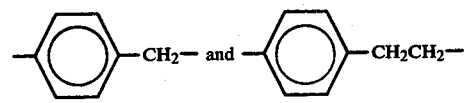

Alkyl or alkoxy groups R, R₁, R₂ and R₂' according to the definition, and also alkyl or alkenyl moieties of substituents X or X' according to the definition, can also be straight-chain or branched.

Examples of alkyl, alkoxy and alkenyl groups according to the definition are: the methyl, ethyl, propyl, isopropyl, n-butyl, tert.-butyl, methoxy, ethoxy, n-propoxy, isopropoxy, n-butoxy, tert.-butoxy, vinyl, allyl and isopropenyl group.

If the substituent X contains an alkenyl group, the latter are, in particular,

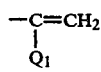

groups in which $Q_1$ is hydrogen or methyl.

A halogen atom R or $R_1$ is in particular a chlorine, bromine or fluorine atom. Alkyl groups R and $R_1$ are advantageously straight-chain and have 1 or 2 C atoms. Preferably, however, R and $R_1$ are each hydrogen.

Alkoxy groups $R_2$ and $R_2'$ are likewise preferably straight-chain and have 1 or 2 C atoms.

$M^+$ is, for example, the lithium, sodium, potassium, trimethylammonium, triethylammonium or methyldiethylammonium cation or the tri-n-octylammonium cation. Preferably, $M^+$ is an alkali metal cation, especially the sodium cation.

Preferred groups

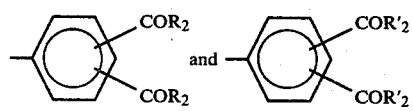

are those in which the groups —$COR_2$ and —$COR_2'$ are bonded to the benzene ring in the 3,5-position and the $R_2$s and $R_2'$s are each —OH, methoxy, ethoxy, phenoxy or chlorine, or those in which the groups —$COR_2$ and —$COR_2'$ are bonded to the benzene ring in the ortho-position relative to one another and the two $R_2$s and $R_2$'s together are —O—.

Preferred tricyclic imidyl groups of the formula I and compounds of the formula II or III are those in which R and $R_1$ are each hydrogen, A is —$CH_2$—, —$CH_2CH_2$— or —$OCH_2$— with the oxygen atom bonded to the aromatic ring, and E is hydrogen.

Compounds of the formula II in which X is a polymerisable group or contains a polymerisable grouping are suitable for homopolymerisation or for copolymerisation with other ethylenically unsaturated comonomers, especially those of the type indicated further below. Compounds of the formula II in which X is a group

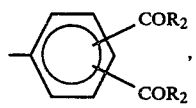

in which the —$COR_2$s are bonded to the benzene ring in the meta- or para-position relative to one another and the $R_2$s are each —OH, —Cl, alkoxy having 1–4 C atoms or phenoxy, or in which the —$COR_2$s are bonded to the benzene ring in the o-position relative to one another and the $R_2$s together form —O—, can be subjected to a polycondensation reaction with suitable diamines, diols, aminoalcohols and, if desired, further di-, tri- or tetra-carboxylic acid derivatives. The co-condensation components which can be employed are, per se, any desired aliphatic, cycloaliphatic, araliphatic, carbocyclic-aromatic or heterocyclic compounds.

Examples of starting polymers which can be reacted with compounds of the formula III are: polyacrylic acid, polymethacrylic acid, copolymers of these acids and other ethylenically unsaturated monomers, copolymers built up from maleic anhydride and ethylenically unsaturated monomers, such as methyl vinyl ether, ethylene, styrene, 1-hexene, 1-decene, 1-tetracene and 1-octadecene, polymers with free hydroxyl groups, such as homopolymers and copolymers of hydroxylalkyl acrylates and hydroxyalkyl methacrylates, polyvinyl alcohols, natural or regenerated cellulose, cellulose derivatives, hydroxyalkylcellulose, polyethers with free OH groups, phenolformaldehyde polycondensation products, polymers with free glycidyl groups, such as copolymers based on glycidyl acrylates and glycidyl methacrylates, polyethyleneimines and polymers with free side amino groups, for example poly-p-aminostyrene.

Preferred polymers according to the invention are those which contain recurring structural elements of the formula IV to VII and X to XIV:

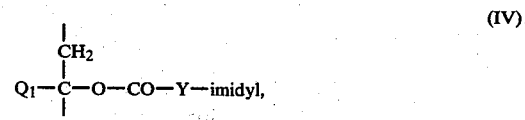

(IV)

(V)

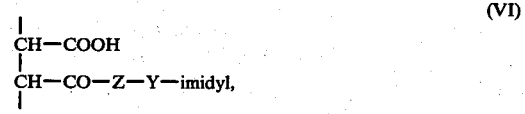

(VI)

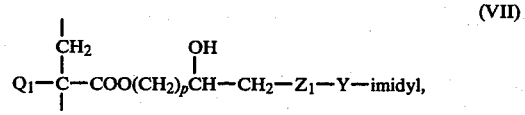

(VII)

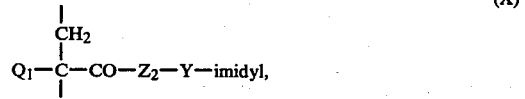

(X)

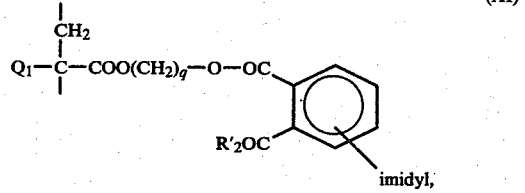

(XI)

-continued

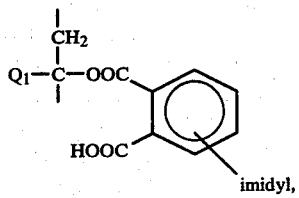
imidyl,

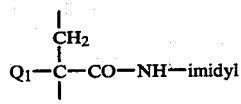

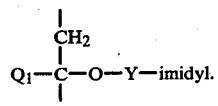

In the above formulae "imidyl" is a radical of the formula I, $R_2'$ is —OH or —O⁻M⁺, $Q_1$ is hydrogen or methyl, q is an integer from 2 to 4, p is the number 1 or 2, Z is —O—, —NH—, —N-alkyl having 1-4 C atoms or —S—, $Z_1$ is —OCO—, —NH—, —N-alkyl having 1-4 C atoms, —O— or —S— and $Z_2$ is —O—, —S— or —NH—.

Further preferred polymers according to the invention are those which, in addition to one or more of the structural elements of the formulae IV to VII and X to XIV, at the same time contain structural elements of the formula XVI

 (XVI)

in which $X_1$ and $X_3$ are each hydrogen, $X_2$ is hydrogen, chlorine or methyl and $X_4$ is hydrogen, methyl, chlorine, —CN, —COOH, —CONH$_2$, phenyl, methylphenyl, methoxyphenyl, cyclohexyl, pyridyl, imidazolyl, pyrrolidyl, —COO-alkyl having 1-12 C atoms in the alkyl moiety, —COO-phenyl,

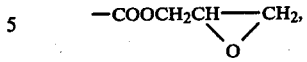

—COO-alkyl-OH having 1-3 C atoms in the alkyl moiety, —OCO-alkyl having 1-4 C atoms in the alkyl, —OCO-phenyl, —CO-alkyl having 1-3 C atoms in the alkyl, alkoxy having 1-6 C atoms or phenoxy, or $X_1$ and $X_2$ are each hydrogen and $X_3$ and $X_4$ together are the grouping

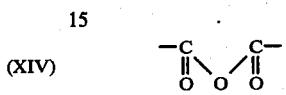 (XIV)

or each are —COOH or —COO-alkyl having 1-6 C atoms in the alkyl.

Copolymers of particular interest amongst those of the last-mentioned type are those which contain structural elements of the formula XVI, in which $X_1$ and $X_3$ are each hydrogen, $X_2$ is hydrogen or methyl and $X_4$ is —OCOCH$_3$, —COOH or —COO-alkyl having 1-8 C atoms in the alkyl, or $X_1$, $X_2$ and $X_3$ are each hydrogen and $X_4$ is —CN, chlorine or phenyl.

Further preferred polymers according to the invention are homopolycondensation products or copolycondensation products which have average molecular weights of between 1,000 and 50,000 and which contain the maleimide groups of the formula I in molecule chain members of the formula XV

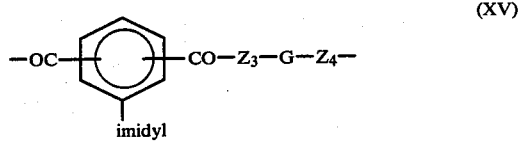 (XV)

in which $Z_3$ and $Z_4$ independently of one another are —O—, —NH— or —S— and G is an aliphatic radical having at least 2 C atoms or a cycloaliphatic, araliphatic, carbocyclicaromatic or heterocyclic-aromatic radical, or $Z_3$-G-$Z_4$- is a grouping of the formulae

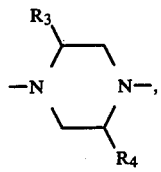

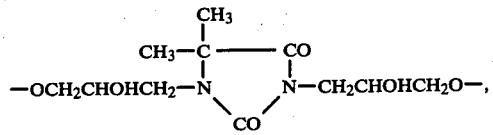

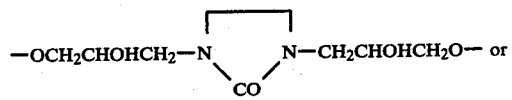 or

-continued

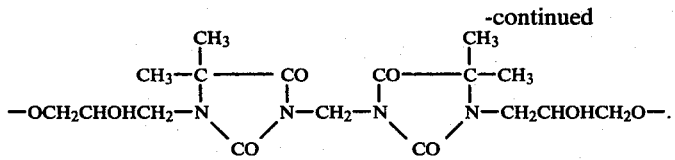

and $R_3$ and $R_4$ independently of one another are hydrogen, methyl or phenyl, the two carbonyl groups in the formula XV being bonded to the benzene ring in the meta- or para-position relative to one another.

Further preferred polymers are those which, in addition to one or more structural elements of the formula XV, at the same time contain structural elements of the formula XVII

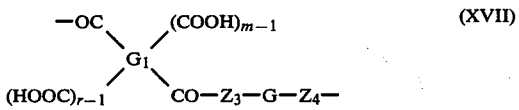

in which $Z_3$, $Z_4$ and G are as defined under formula XV, m and r independently of one another are the number 1 or 2 and $G_1$ is an aliphatic radical having at least 2 C atoms or a cycloaliphatic, araliphatic, carbocyclic-aromatic or heterocyclic-aromatic radical and in which the carbonyl and carboxyl groups are bonded to different C atoms and, in the case of cyclic radicals $G_1$, are bonded in pairs to adjacent C atoms.

An aliphatic radical G is, in particular, straight-chain or branched alkylene having 2-12 C atoms, it being possible for the alkylene chain also to be interrupted by hetero-atoms, such as O, S or N atoms. A cycloaliphatic radical G is, for example, the 1,3- or 1,4-cyclohexylene group, the 1,4-bis-(methylene)-cyclohexane group or the dicyclohexylmethane group. Araliphatic radicals G are, in particular, 1,3-, 1,4- or 2,4-bis-alkylenebenzene, 4,4'-bis-alkylenediphenyl and 4,4'-bis-alkylenediphenyl ether groups, in particular the 1,3- and 1,4-xylylene group and the 1,3-tolylene group. Carbocyclic-aromatic radicals G can be mononuclear or polynuclear and fused or non-fused and in the latter case the aromatic nuclei are bonded to one another via a bridge member. In particular, such radicals are phenylene or naphthylene groups which are unsubstituted or substituted by alkyl or alkoxy groups each having 1-4 C atoms or by halogen atoms, such as chlorine, bromine or fluorine, or groups of the formula

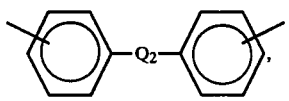

in which $Q_2$ is —O—, —$CH_2$—, —S—, —$SO_2$— or —$C(CH_3)_2$—. Heterocyclic-aromatic radicals G are, for example, five-membered or six-membered ring systems containing N, O and/or S.

An aliphatic radical $G_1$ is, for example, straight-chain or branched alkylene having 2-12 C atoms, especially straight-chain alkylene having 2-10 C atoms. Cycloaliphatic radicals $G_1$ are, in particular, 5-membered or 6-membered cycloalkyl groups. A carbocyclic-aromatic radical $G_1$ preferably contains at least one 6-membered ring; in particular such radicals are monocyclic, fused bicyclic or non-fused bicyclic radicals and the latter can also be bonded to one another via a bridge member, such as —CO— or —$CH_2$—. Heterocyclic-aromatic radicals $G_1$ are especially 5-membered or 6-membered heterocyclic-aromatic ring systems which contain O, N and/or S and can be benzo-condensed.

When m and r=1, $G_1$ is preferably straight-chain alkylene having 2-10 C atoms or 1,3- or 1,4-phenylene. If one of m and r is the number 1 and the other is the number 2, $G_1$ is, in particular, a benzenetriyl group. When m and r=2, $G_1$ is, in particular, a benzenetetrayl group or the benzophenone ring system.

Copolycondensates of the last-mentioned type which are particularly advantageous industrially are those which contain recurring structural elements of the formula XVa

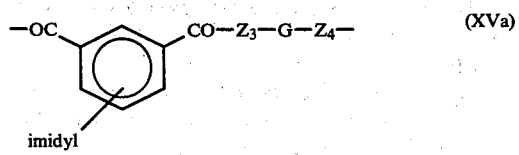

and can contain recurring structural elements of the formula XVIIa

in which formulae "imidyl" is a radical of the formula I in which R and $R_1$ are each hydrogen, A is —$CH_2$—, —$CH_2CH_2$— or —$OCH_2$— with the oxygen atom bonded to the aromatic ring and E is hydrogen, and $Z_3$ and $Z_4$ are each —NH— or —O—, G is alkylene having 2-12 C atoms or arylene having 6-10 C atoms, which can be substituted by halogen atoms or alkyl groups having 1-4 C atoms, and $G_1$ is alkylene having 2-10 C atoms or 1,3- or 1,4-phenylene, or —$Z_4$—G—$Z_3$— is the grouping

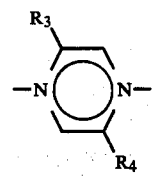

in which $R_3$ and $R_4$ are each hydrogen or methyl.

Polymers containing recurring structural elements of the formula XV can be obtained by subjecting a compound of the formula II, in which n is the number 1 and X is a group of the formula

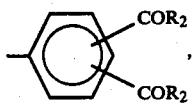

in which the —COR₂s are bonded to the benzene ring in the meta- or para-position relative to one another and the R₂s are each —OH, —Cl, alkoxy having 1-4 C atoms or phenoxy, to a polycondensation reaction with a compound of the formula XVIII

HZ₃—G—Z₄H  (XVIII)

if desired in the presence of a di-, tri- or tetracarboxylic acid derivative, for example those of the formula XIX

  (XIX)

in which formulae $Z_3$, $Z_4$, G, $G_1$, m and r are as defined above and $M_1$, when m and r=1, is —OH, —Cl, alkoxy having 1-4 C atoms or phenoxy and, when m and/or r=2, together with $M_2$ is —O—.

Finally, polymers which contain recurring structural elements of the formulae IV to VIII or XII can be prepared by (A) reacting a compound of the formula III in which Y is as defined, n is the number 2 and X' is —COCl or —COOH with a polymer containing recurring structural elements of the formulae IVa or Va

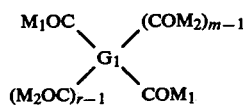

(B) reacting a compound of the formula III in which Y is as defined, n is the number 2 and X' is —OH, —NH₂, —NH-alkyl having 1-4 C atoms or —SH with a polymer containing recurring structural elements of the formula VIa

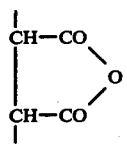  (VIa)

(C) reacting a compound of the formula III in which Y is as defined, n is the number 2 and X' is —OH, —NH₂, —NH-alkyl having 1-4 C atoms, —SH or —COOH with a polymer containing recurring structural elements of the formulae VIIa or VIIIa

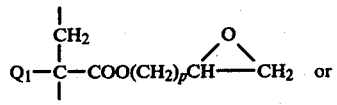  (VIIa)

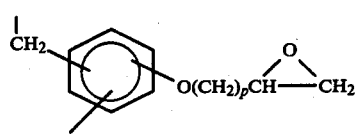  (VIIIa)

or (D) reacting a compound of the formula III in which n is the number 1 and X' is a group

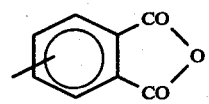

with a polymer containing recurring structural elements of the formula IVa, $Q_1$ and p in the above formulae being as defined above.

Particularly preferred polymers are those which contain recurring structural elements of the formulae IV, V, VI, VII, VIII, X, XII or XIV and can contain recurring structural elements of the formula XVI and in which, in the imidyl radical of the formula I, R and $R_1$ are each hydrogen, A is —CH₂—, —CH₂CH₂— or —OCH₂— with the oxygen atom bonded to the aromatic ring and E is hydrogen, Y is straight-chain or branched alkylene having 2-11 C atoms, 1,3- or 1,4-phenylene or 1,4-cyclohexylene, Z is —O— or —NH—, $Z_1$ is —OCO— or —NH—, p is the number 1 and $Q_1$ is methyl or in particular hydrogen and $X_1$, $X_2$, $X_3$ and $X_4$ have the preferred meaning defined above.

A particularly preferred type of polymers according to the invention comprises those which are based on novolacs as the starting material and which contain recurring structural elements of the formula VIII

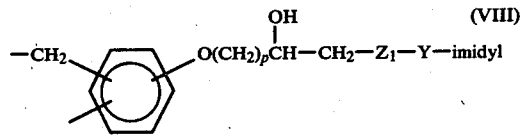  (VIII)

in which p, $Z_1$, Y and imidyl are as defined for formula VII.

Finally, further preferred polymers are those which contain recurring structural elements of the formulae IV, V, VI, VII, VIII, X, XII or XIV and can contain recurring structural elements of the formula XVI and in which, in the imidyl radical of the formula I, R and $R_1$ are each hydrogen, A is —CH₂—, —CH₂CH₂— or —OCH₂— with the oxygen atom bonded to the aromatic ring and E is hydrogen, Y is straight-chain or branched alkylene having 2-11 C atoms, 1,3- or 1,4-phenylene or 1,4-cyclohexylene, Z is —O— or —NH—, $Z_1$ is —OCO— or —NH—, p is the number 1, $Q_1$ is methyl or in particular hydrogen and $X_1$ and $X_3$ are each hydrogen, $X_2$ is hydrogen or methyl and $X_4$ is —OCOCH$_3$, —COOH or —COO-alkyl having 1-8 C atoms in the alkyl, or $X_1$, $X_2$ and $X_3$ are each hydrogen and $X_4$ is —CN, chlorine or phenyl.

The incorporation of tricyclic imidyl groups according to the invention into existing polymer chains by means of a condensation or addition reaction and also the build-up of polymers according to the invention, for example those containing structural elements of the formula XV, by polycondensation of suitable monomers can be carried out in a manner known per se, advantageously at temperatures of about −50° C. to +150° C. The reaction is preferably carried out in an inert organic solvent or a solvent mixture and in the case of condensation reactions is preferably carried out at temperatures of about −20° C. to +100° C. Addition reactions are advantageously carried out at elevated temperature, in general at temperatures between about 80° and 120° C. or at the reflux temperature.

Suitable solvents for carrying out the condensation or addition reactions are, for example: aliphatic or cyclic ketones, such as acetone, methyl ethyl ketone, isopropyl methyl ketone, cyclohexanone, cyclopentanone and γ-butyrolactone; cyclic ethers, such as tetrahydrofuran, tetrahydropyran and dioxan; cyclic amides, such as N-methyl-2-pyrrolidone, N-ethyl-2-pyrrolidone and N-methyl-ε-caprolactam; N,N-dialkylamides of aliphatic monocarboxylic acids having 1-3 C atoms in the acid moiety, such as N,N-dimethylformamide, N,N-dimethylacetamide, N,N-diethylacetamide and N,N-dimethylmethoxyacetamide; pyridine and pyridine bases or tertiary amines, in particular trialkylamines and dialkylbenzylamines having, preferably 1-4 C atoms in the alkyl moieties, for example triethylamine and diethylbenzylamine; and dialkylsulphoxides, such as dimethylsulphoxide and diethylsulphoxide.

Preferred solvents for condensation reactions are cyclic amides and N,N-dialkylamides of the abovementioned type, especially N-methyl-2-pyrrolidone, N,N-dimethylformamide and N,N-dimethylacetamide. For addition reactions, cyclic ethers and cyclic ketones, in particular tetrahydrofuran and cyclohexanone, and also pyridine are preferred.

Catalysts which promote the desired linking can also be added to the reaction solution. Thus, for example, the addition of tertiary amines, such as triethylamine or pyridine, quaternary ammonium salts, such as tetraalkylammonium chlorides having, in each case, 1-4 and preferably 1 or 2 C atoms in the alkyl groups, p-toluenesulphonic acid or concentrated sulphuric acid is advantageous for the formation of esters.

After the reaction, the polymers modified by the tricyclic imidyl groups according to the definition can be precipitated by the addition of a slightly polar solvent. Examples of such slightly polar solvents are dialkyl ethers having, in each case, 2-4 C atoms in the alkyl moieties, such as diethyl ether and di-n-propyl ether, alcohols having up to 6 C atoms, such as methanol, ethanol, isopropanol, butanols and pentanols, and aliphatic, cycloaliphatic or aromatic hydrocarbons, such as n-pentane, n-hexane, cyclohexane, benzene and toluene.

The homopolymerisation of compounds of the formula II in which X is a polymerisable group or contains a polymerisable grouping, and also the copolymerisation of these compounds with other ethylenically unsaturated monomers, for example those of the formula XVIa, can likewise be carried out in a manner known per se, for example in the presence of customary cationic and anionic initiators. Free radical polymerisation is preferred. In this case it is advantageous to use about 0.01 to 5% by weight and preferably 0.01 to 1.5% by weight, based on the total weight of monomers, of free radical initiators known per se, such as inorganic or organic peroxides or azo compounds, for example hydrogen peroxide, potassium peroxydisulphate, tert.-butyl hydroperoxide, di-tert.-butyl peroxide, peracetic acid, benzoyl peroxide, diacyl peroxide, cumene hydroperoxide, tert.-butyl perbenzoate, tert.-alkyl peroxycarbonates and α,α'-azoisobutyronitrile. The reaction temperatures for the free radical polymerisation are generally between about 30° and 100° C. The free radical polymerisation can, however, also be carried out in the cold and, for this purpose, it is also possible to use redox systems in the abovementioned concentrations, for example mixtures of peroxides, such as hydrogen peroxide, and a reducing agent, such as divalent iron ions.

The polymerisation can be carried out in homogeneous phase, for example in bulk (block polymerisation) or in solution, or in heterogeneous phase, i.e. as precipitation polymerisation, emulsion polymerisation or suspension polymerisation. Polymerisation in solution is preferred.

Suitable solvents are those of the type mentioned for the condensation and addition reactions and also: halogenated aromatic hydrocarbons, such as chlorobenzene and dichlorobenzenes; chlorinated aliphatic hydrocarbons, such as methylene chloride, chloroform, tetrachloroethane and tetrachloroethylene; alkyl esters of aliphatic monocarboxylic acids having a total of 2-6 C atoms, such as methyl formate, ethyl formate and n-butyl formate or methyl acetate, ethyl acetate and n-butyl acetate; and ethylene glycol dialkyl ethers having 1-4 C atoms in the alkyl moieties, such as ethylene glycol dimethyl ether, ethylene glycol diethyl ether and ethylene glycol di-n-butyl ether.

Mixtures of such solvents can also be used.

After the reaction has ended, the polymer can be precipitated by pouring the reaction mixture into suitable organic solvents, for example aliphatic hydrocarbons, alcohols or dialkyl ethers, such as n-pentane, n-hexane, methanol, ethanol and diethyl ether.

The compounds of the formula II and III which are to be used for the preparation of the polymers according to the invention and in which A is —CH$_2$—, —CH$_2$CH$_2$— or —OCH$_2$— with the oxygen atom bonded to the aromatic ring and E is hydrogen and Y, n, X and X' are as defined can be prepared by reacting a compound of the formula XX

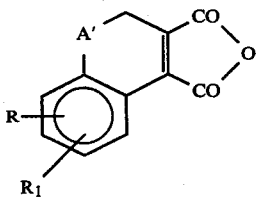

in which A' is —CH$_2$—, —CH$_2$CH$_2$— or —OCH$_2$— with the oxygen atom bonded to the aromatic ring and R and R$_1$ are as defined under formula I, with a compound of the formula XXI

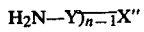 (XXI)

in which Y and n are as defined under formula II and X'', when n=1, is a group of the formula

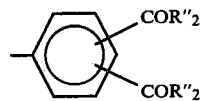

and, when n=2, is —OH, —NH$_2$, —NH-alkyl having 1–4 C atoms, —COOH, —SH or —O-alkenyl having 2–4 C atoms in the alkenyl moiety, and the —COR$_2$'' groups are bonded to the benzene ring in the meta- or para-position relative to one another and the R$_2$''s are each —OH, —Cl, alkoxy having 1–4 C atoms or phenoxy, or the —COR$_2$'' groups are bonded to the benzene ring in the ortho-position relative to one another and the R$_2$''s together form —O—, and M$^+$ is as defined under formula II, if necessary cyclising amidocarboxylic acids which have formed as intermediates and, if desired, subsequently converting the imide into a compound of the formula II or III in which X'' differs from X and X'.

Compounds of the formula II and III in which A is —O— and E is —CH$_3$ and R, R$_1$, Y and n are as defined under formula I or II can be obtained by rearranging a compound of the formula II or III in which A=—OCH$_2$— into a compound of the formula II or III in which A=—O— and E=—CH$_3$, by the action of heat or in the presence of a basic catalyst.

The compounds of the formula XXI and the compounds of the formula XX in which A' is —CH$_2$— are known or can be prepared according to methods known per se. Compounds of the formula XX in which A' is —CH$_2$CH$_2$— or —OCH$_2$— can be prepared, for example, by reacting 5-phenylvaleric acid esters or phenoxybutyric acid esters, which can be ring-substituted, with an oxalic acid diester to give the 3-phenylpropyl- or 2-phenoxyethyl-oxaloacetic acid diester and treating the reaction product with a strong acid, such as concentrated sulphuric acid.

The reaction of the amines of the formula XXI with the anhydrides of the formula XX can be carried out in the melt by heating the reactants to temperatures of up to about 250° C., or, alternatively, can be carried out in an aqueous, aqueous-organic or organic medium. The organic solvents are in particular aprotic organic solvents, for example aliphatic or aromatic hydrocarbons, which can be halogenated, cyclic ethers, cyclic amides, N,N-dialkylamides of aliphatic monocarboxylic acids or dialkylsulphoxides of the abovementioned type.

Amidocarboxylic acids which may have been formed as intermediates can be cyclised to the imides in a manner known per se, chemically or by the action of heat.

The conversion to compounds of the formula II or III in which X'' differs from X and X' can likewise be carried out in a manner known per se, for example:

X=—NH—CO-alkenyl (n=1 or 2): by reacting reaction products in which n=1 or 2 and X''=—NH$_2$ with alkenyl-COCl.

X or X'=a phthalic anhydride radical or one R$_2$ in the ortho-position=—OH and the other R$_2$=

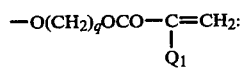

by cyclising corresponding compounds in which X''=a phthalic acid radical and, if necessary, subsequently reacting the product with alcohols

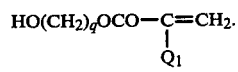

X''=—COCl or R$_2$=—Cl: by treating the free acids with a chlorinating agent, such as thionyl chloride, oxalyl chloride or phosgene.

X=—CO—O-alkenyl: by reacting the corresponding free acids or the acid chlorides with unsaturated esters or alcohols in the presence of acids or bases.

X=—O—CO-alkenyl or —S—CO-alkenyl: by reacting compounds of the formula III in which X'=—OH or —SH with corresponding unsaturated acids, acid chlorides or esters.

The polymers according to the invention are photocrosslinkable and are suitable, for example, for the production of printing plates for the offset printing process, for the production of photo-offset lacquers and for unconventional photography, for example for staining polymer images which are difficult to see after exposure and developing, staining being carried out with suitable dyes, such as oil-soluble dyes or, if the polymer contains acid groups, such as carboxylic acid groups or sulphonic acid groups, cationic dyes. The polymers according to the invention are used, in particular, as so-called photoresists for the production of printed circuits by methods known per se. In this case, the side of the conductor plate provided with the photo-sensitive layer is exposed through a transparency negative containing the conductor image and then developed, after which the unexposed areas of the layer are removed by developer liquid. Exposure can be carried out with sunlight, carbon arc lamps or xenon lamps. Advantageously, exposure is carried out with mercury high pressure lamps. The support materials can be coated with the photosensitive polymers by techniques which are customary per se, for example by dipping processes, spraycoating, whirler coating, cascade-coating or curtain-coating or "roller-coating".

EXAMPLE 1

100 g of a copolymer of methyl vinyl ether and maleic anhydride (1:1; anhydride content=0.64 mol, average molecular weight 740,000), 77.8 g (0.32 mol) of N-(2'-hydroxyethyl)-3,4-dihydronaphthalene-1,2-dicarboximide and 10 ml of pyridine are dissolved in 1,820 ml of dried tetrahydrofuran. The reaction mixture is kept at 80° C. for 72 hours, with stirring. After cooling to room temperature (20°–25° C.), the clear solution is precipitated in 5 liters of diethyl ether and the precipitate is dried in vacuo. This yields 141.0 g (79.3% of theory) of a white polymer. For elementary analysis, a sample of the polymer is precipitated in 0.1 N HCl.

Elementary analysis: found: C 55.3%, H 5.9%, N 2.23%.

Further polymers are prepared in an analogous manner using the components indicated in Table I below.

4.1 g of polyvinyl alcohol with an average molecular weight of about 13,000 and a residual acetate content of 12% are heated together with 36.6 ml of anhydrous pyridine for 15 hours at 100° C. A further 36.6 ml of anhydrous pyridine are then added and the solution is cooled rapidly to 50° C. 0.59 g of diazabicyclooctane, dissolved in 3.7 ml of anhydrous pyridine, are now added, directly thereafter 12.9 g (0.038 mol) of N-(caproic acid chloride)-3,4-dihydronaphthalene-1,2-dicarboximide are added in portions and the resulting mixture is stirred for 4 hours at 50° C. After cooling to room temperature, 90 ml of acetone are added. The pyridinium hydrochloride which has precipitated out is filtered off and the filtrate is precipitated in 2 liters of water. After drying the product over $P_2O_5$, 10 g (75.8% of theory) of a brownish polymer which has a viscosity, $\eta$ inherent (25° C., DMF), of 0.3 are obtained.

EXAMPLE 8

31.1 g (0.1 mol) of N-(2'-methacryloyloxyethyl)-3,4-

TABLE I

| Example No. | Imide | Polymer | g of imide | g of polymer |
|---|---|---|---|---|
| 2 | N—(2'-hydroxyethyl)-6,7-dihydro-5H-benzocycloheptene-8,9-dicarboxylic acid imide | $\left[\begin{array}{c}\text{—CH——CH—CH}_2\text{—CH—}\\ \text{O=C} \quad \text{C=O} \quad \text{OCH}_3 \\ \diagdown \text{O} \diagup \end{array}\right]_n$ | 82.3 | 100 |
| 3 | N—(2'-hydroxyethyl)-2-methyl-2H-chromene-3,4-dicarboximide | " | 82.9 | 100 |
| 4 | N—(2'-hydroxyethyl)-2,3-dihydro-1-benzoxepine-4,5-dicarboximide | " | 78.4 | 100 |
| 5 | N—(3'-hydroxy-2',2'-dimethyl-propyl)-3,4-dihydronaphthalene-1,2-dicarboxylic acid imide | " | 87.4 | 100 |
| 6 | N—(3'-hydroxy-2',2'-dimethyl-propyl)-6,7-dihydro-5H-benzo-cycloheptene-8,9-dicarboxylic acid imide | " | 95.6 | 100 |

EXAMPLE 7

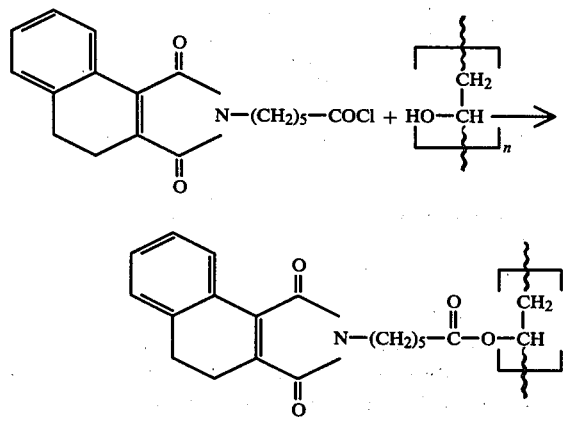

dihydronaphthalene-1,2-dicarboxylic acid imide together with 0.31 g of α,α'-azoisobutyronitrile are dissolved in 140 ml of tetrahydrofuran. The reaction mixture is polymerised under a gentle reflux (about 80° C.) for 6 hours under nitrogen and with continuous stirring. After the reaction has ended, the reaction solution is cooled to room temperature and the polymer is precipitated by adding the reaction solution dropwise to 2 liters of hexane. This yields 24.4 g (78.5% of theory) of a white powder; inherent viscosity: 0.15 dl/g (0.5% by weight, measured at 20° C. in N,N-dimethylformamide).

EXAMPLES 9 TO 14

Further photo-sensitive polymers are prepared under reaction conditions analogous to those in Example 8; the preparation and viscosity in chloroform of these polymers are illustrated in Table II.

TABLE II

| | (analogous to Example 7 in the text) | | | | | |
|---|---|---|---|---|---|---|
| Ex- | Polymer composition | | | | | $\eta$ limiting |
| ample | Monomer I | Mol % | Monomer II | Mol % | Yield | in $CHCl_3$ |
| 9 | N—(2-methacryloyloxyethyl)-3,4-dihydronaphthalene-1,2- | 100 | — | — | 70% | 0.075 dl/g* |

TABLE II-continued
(analogous to Example 7 in the text)

| Example | Monomer I | Mol % | Monomer II | Mol % | Yield | η limiting in CHCl₃ |
|---|---|---|---|---|---|---|
| 10 | N—(2-methacryloyloxyethyl)-3,4-dihydronaphthalene-1,2-dicarboxylic acid imide | 70 | N—vinyl-2-pyrrolidone | 30 | 16% | 0.12 dl/g |
| 11 | N—(2-methacryloyloxyethyl)-3,4-dihydronaphthalene-1,2-dicarboxylic acid imide | 60 | 2-ethylhexyl acrylate | 40 | 18% | 0.2 dl/g |
| 12 | N—(2-methacryloyloxyethyl)-3,4-dihydronaphthalene-1,2-dicarboxylic acid imide | 50 | methyl methacrylate | 50 | 38% | 0.18 dl/g |
| 13 | N—(2-methacryloyloxyethyl)-3,4-dihydronaphthalene-1,2-dicarboxylic acid imide | 60 | 4-vinylpyridine | 40 | 9% | 0.08 dl/g |
| 14 | N—(2-acryloyloxyethyl)-3,4'-dihydronaphthalene-1,2-dicarboxylic acid imide | 100 | — | — | 40% | 0.06 dl/g |

*Tg 126° C.
Mw 36,000

EXAMPLE 15

2.5 g (0.00662 mol) of N-(3-isophthaloyldicarboxylic acid)-6,7-dihydro-5H-benzocycloheptene-8,9-dicarboxylic acid imide and 1.75 g (0.00729 mol) of 1,3-diglycidyl-5,5-dimethylhydantoin are dissolved in 85 ml of cyclohexanone and 1 crystal of tetrabutylammonium chloride is added. The solution is stirred at 110° C. for 2 hours. The yellow, slightly viscous solution can be used direct for coating copper plates. The inherent viscosity of the polyester formed is measured on a 0.5% by weight solution in cyclohexanone at 20° C.

EXAMPLE 16

7.3 g (0.0639 mol) of 2,5-dimethylpiperazine and 18 ml of triethylamine are dissolved in 100 ml of dry chloroform in a 750 ml sulphonation flask and the solution is cooled to −5° C. At this temperature, a suspension of 8 g (0.0193 mol) of N-(3-isophthaloyldicarboxylic acid chloride)-6,7-dihydro-5H-benzocycloheptene-8,9-dicarboxylic acid imide and 10.78 g (0.045 mol) of sebacic acid dichloride in 100 ml of chloroform is added dropwise. The reaction mixture is stirred for 3 hours at room temperature and the slightly viscous solution is precipitated with 1,500 ml of petroleum ether. 13 g of beige polymer are obtained.

EXAMPLE 17

This example relates to images which are produced by photocrosslinking polymers according to the invention and are rendered more easily visible by staining and to the determination of the relative sensitivity of the images thus obtained. A 400 watt mercury vapour high pressure lamp at a distance of 40 cm from the vacuum table is used for exposure. The original used is a Stauffer step wedge as described in "Photoresist, Material and Processes", W. S. De Forest, page 110 (McGraw-Hill Book Company, New York, 1975).

Coating: The photo-crosslinkable polymer is applied to aluminium plates (about 0.3 mm) by whirler-coating at 1,000 revolutions/minute from a 5% solution in N,N-dimethylformamide.

Developing: 3 seconds in tetrahydrofuran; 30 seconds in 3% NaHCO₃.H₂O.

Staining: The polymer which has been crosslinked image-wise can subsequently easily be stained with a cationic dye, for example by staining for 30 seconds in a 5% aqueous solution of the dye of the formula

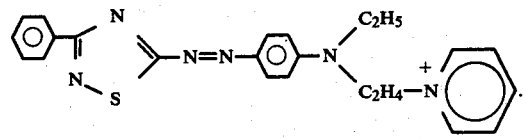

Table III below gives the number of stained steps in the step wedge with the corresponding exposure time.

TABLE III

| Polymer according to | Exposure time | Number of stained steps in the step wedge |
|---|---|---|
| Example 1 | 6 minutes | 9 |
|  | 3 minutes | 7 |
|  | 1 minute | 5 |
| Example 2 | 9 minutes | 5 |
|  | 6 minutes | 2 |
|  | 3 minutes | 1 |
| Example 3 | 9 minutes | 5 |
|  | 6 minutes | 3 |
|  | 3 minutes | 1 |
| Example 4 | 9 minutes | 7 |
|  | 6 minutes | 5 |
|  | 3 minutes | 3 |

EXAMPLE 18

This example relates to images which are produced by photocrosslinking polymers according to the invention on copper-coated plates. The original used is a Stauffer step wedge, and a 400 watt mercury vapour high pressure lamp at a distance of 40 cm from the vacuum stage is used for exposure. After exposure, the image is developed in a chloroform bath and the parts of the copper which are now uncovered are rendered more easily visible by etching slightly in FeCl₃ solution.

Coating: The polymer is applied to copper-coated epoxide plates by whirler-coating at 1,000 revolutions/ minute from a 5% solution in N,N-dimethylformamide (layer thickness of the dry polymer about 1-3 nm).

Table IV below gives the number of steps of the step wedge shown on the image with the corresponding exposure time.

TABLE IV

| Example | Exposure time | Number of steps shown on the image |
|---------|---------------|------------------------------------|
| 7       | 3'            | 2                                  |
|         | 6'            | 3                                  |
| 9       | 3'            | 5                                  |
|         | 6'            | 6                                  |
| 10      | 12            | 5                                  |
| 11      | 3'            | 4                                  |
|         | 6'            | 5                                  |
| 12      | 6'            | 5                                  |
| 14      | 6'            | 4                                  |

Examples of the preparation of starting materials of the formula II or III for the photocrosslinkable polymers

Example (a)

N-(2'-Hydroxyethyl)-3,4-dihydronaphthalene-1,2-dicarboximide

A solution of 70 g (0.35 mol) of 3,4-dihydronaphthalene-1,2-dicarboxylic acid anhydride [prepared according to Org. Syntheses, Col., Vol. 2, 194 (1943)] and 23.5 g (0.385 mol) of ethanolamine in 1.7 liters of glacial acetic acid is kept under reflux for 24 hours. The glacial acetic acid is then removed by distillation, the residue is dissolved in 2 liters of absolute ethanol, 50 g of an ion exchanger ("Dowex 50 W" from Fluka AG) are added and the suspension is kept under reflux for 24 hours. The ion exchanger is then filtered off, the ethanol is distilled off and the residue is recrystallised from diethyl ether/ethanol. This yields 61.8 g (73% of theory) of N-(2'-hydroxyethyl)-3,4-dihydronaphthalene-1,2-dicarboximide; melting point 120.5°-121° C.

Example (b)

N-(2'-Hydroxyethyl)-6,7-dihydro-5H-benzocycloheptene-8,9-dicarboxylic acid imide 1. 4.5 g of ethanolamine are added at room temperature (20°-25° C.) to a solution of 15 g (0.07 mol) of 6,7-dihydro-5H-benzocycloheptene-8,9-dicarboxylic acid anhydride in 150 ml of toluene. The mixture is refluxed for 2 hours and the water formed is removed continuously using a water separator. The toluene is then removed by distillation and the residue is recrystallised from ethanol. This yields 1.4 g (82% of theory) of yellow crystals with a melting point of 115° C.

The preparation of 6,7-dihydro-5H-benzocycloheptene-8,9-dicarboxylic acid anhydride is described in paragraphs 2. 3. and 4. below:

2. Ethyl 5-phenylvalerate 250 g (1.4 mols) of 5-phenylvaleric acid are dissolved in 450 ml of absolute ethanol. 114 ml of concentrated sulphuric acid are added to the clear colourless solution and the reaction mixture is refluxed for 48 hours. The reaction mixture, which initially is two-phase, becomes almost homogeneous and separates into two phases again on cooling. The cold two-phase reaction mixture is poured onto diethyl ether and about 1 kg of ice. The aqueous phase is extracted with ether twice more. The ether phases are washed twice with 2 N sodium carbonate solution and twice with NaCl solution. The combined ether phases are dried over MgSO₄ and the solvent is removed on a rotary evaporator. After drying under a high vacuum at room temperature, 281.7 g of a colourless oil (97.5% of theory) are obtained.

The crude product is used further (cf. paragraph 4.).

3. Diethyl 3-phenylpropyl-oxaloacetate

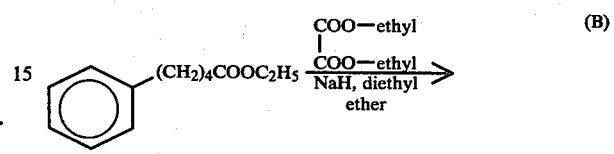

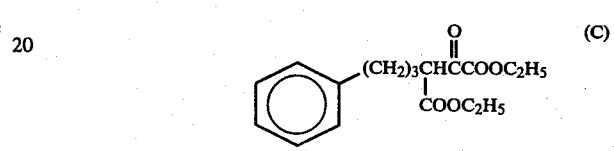

A suspension of oil-free sodium hydride in diethyl ether, prepared by decanting and twice washing with diethyl ether 71.8 g of a sodium hydride dispersion (55% in oil) in n-pentane under nitrogen, and adding 3 liters of absolute diethyl ether are refluxed. A mixture of 281.7 g (1.36 mols) of ethyl 5-phenylvalerate and 297 g (1.36 mols+50%) of diethyl oxalate is added dropwise to the boiling suspension in the course of about 6 hours. The reaction mixture is then kept under reflux for a total of 66 hours. The thin layer chromatogram (CHCl₃) shows, in addition to a very small amount of starting material (R$_f$ about 0.6), a main spot with a R$_f$ of about 0.5. After cooling, the reaction mixture is poured onto 500 g of ice and 1.05 equivalents of HCl (=530 ml of 2 N HCl). The aqueous phase is extracted with diethyl ether, the diethyl ether phase is dried over MgSO₄ and the ether is removed in vacuo. After drying in vacuo, 520 g of a reddish oil, which still contains oxalate, are obtained. The crude product is used further direct.

4. 6,7-Dihydro-5H-benzocycloheptene-8,9-dicarboxylic acid anhydride

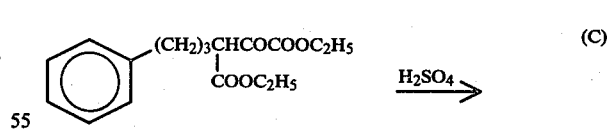

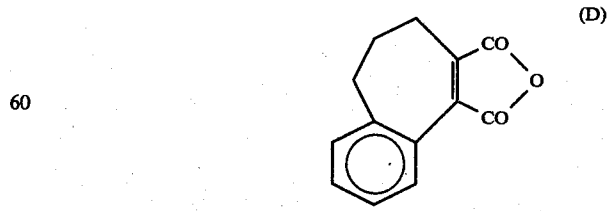

240 ml of 90% sulphuric acid are cooled to 0°-5° C. 30 g of ester C are added dropwise at this temperature in the course of about 15-20 minutes. A dark yellow to reddish solution forms. The reaction mixture is then allowed to thaw to room temperature and the course of the reaction is followed by means of thin layer chromatography. After about 3 to 4 hours no further starting material is visible. Thin layer chromatogram (CHCl₃) starting material: R_f about 0.7; reaction product: R_f about 0.8.

The reaction mixture is poured onto 1.5 liters of ice and sufficient NaCl to saturate the resulting aqueous phase (about 500 g). With vigorous stirring, a white, crystalline precipitate separates out. This is filtered off with suction, the material on the filter is subjected to strong suction and taken up in diethyl ether and insoluble constituents are separated off. The ether solution is dried over MgSO₄, concentrated on a rotary evaporator and dried under a high vacuum: 1st portion of product D. The aqueous phase is extracted with diethyl ether and the diethyl ether phase is washed with NaCl solution and dried and the ether is removed on a rotary evaporator: 2nd portion of product D. On the basis of the thin layer chromatogram, this portion is virtually identical to the first portion. The two portions are combined and recrystallised from isopropanol. This yields 10 g (47% of theory) of compound D in the form of pale yellowish crystals; melting point 112°–113° C.

Example (c)

N-(2′-Hydroxyethyl)-2-methyl-2H-chromene-3,4-dicarboximide and
N-(2′-hydroxyethyl)-2,3-dihydro-1-benzoxepine-4,5-dicarboximide

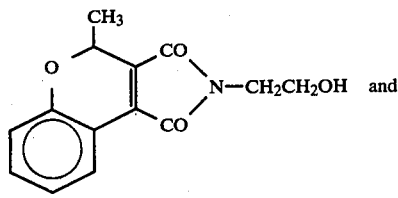

(A)

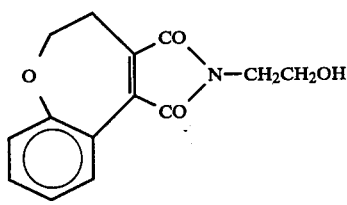

(B)

A solution of 48.65 g (0.2 mol) of 2,3-dihydro-1-benzoxepine-4,5-dicarboxylic acid anhydride and 13.4 g (0.22 mol) of ethanolamine in 1.5 liters of glacial acetic acid is refluxed for 2 days. The glacial acetic acid is then distilled off, the residue is dissolved in 2 liters of absolute methanol, 70 g of an ion exchanger ("Dowex 50 W" from Fluka AG) are added and the suspension is refluxed for 2 days. The ion exchanger is then filtered off, the methanol is removed by distillation and the residue is separated on a silica gel column (solvent system: toluene/ethyl acetate in a volume ratio of 2:1). The first fraction (R_f about 0.3) contains 9.3 g (18% of theory) of N-(2′-hydroxyethyl)-2-methyl-2H-chromene-3,4-dicarboximide (compound A) in the form of yellow crystals (recrystallised from methylene chloride/n-hexane); melting point 124° C.

The second fraction (R_f about 0.2) contains 41.5 g (80% of theory) of N-(2′-hydroxyethyl)-2,3-dihydro-1-benzoxepine-4,5-dicarboximide (compound B); melting point 136°–137° C. (recrystallised from CH₂Cl₂/n-hexane).

The starting material [2,4-dihydro-1-benzoxepine-4,5-dicarboxylic acid anhydride] can be prepared as follows:

A solution of 22 g (0.15 mol) of diethyl oxalate in 100 ml of diethyl ether is added dropwise, at a temperature of 15° C., to a suspension of 5 g (0.104 mol) of a 50% dispersion of sodium hydride in mineral oil in 50 ml of diethyl ether, with stirring. The reaction mixture is then stirred for 2 hours at room temperature. A solution of 21 g (0.10 mol) of ethyl phenoxy-butyrate [prepared according to Powell and Adams, J. Amer. Chem. Soc., 42, 652 (1920)] in 100 ml of diethyl ether is allowed to run in and the resulting mixture is then refluxed for 10 hours. After cooling, 1 ml of ethanol is added and the mixture is then poured onto a mixture of 100 g of ice and 150 ml of water. The pH of the aqueous phase is adjusted to 3 with 2 N hydrochloric acid. The layers are separated in a separating funnel and the aqueous phase is again extracted with 250 ml of diethyl ether. The combined ether extracts are washed with 100 ml of water, dried over magnesium sulphate and then evaporated under a waterpump vacuum. 30.8 g (100% of theory) of crude diethyl 2-phenoxyethyl-oxaloacetate in the form of a pale reddish oil remain as the residue.

30.8 g (0.10 mol) of crude diethyl 2-phenoxyethyloxaloacetate are allowed to run dropwise in the course of 15 minutes, at a temperature of 5°–10° C., into an ice-cooled mixture of 225 ml of concentrated sulphuric acid and 25 ml of water. The reaction temperature is then allowed to rise to 15° C. and the reaction mixture is stirred for one hour at this temperature. The reaction mixture is then poured into a mixture of 1,000 g of ice and 1,500 ml of water, with stirring, whereupon 2,3-dihydro-1-benzoxepine-4,5-dicarboxylic acid anhydride precipitates out. This is filtered off with suction and recrystallised from isopropanol. This yields 14.0 g of 2,3-dihydro-1-benzoxepine-4,5-dicarboxylic acid anhydride (64.7% of theory) with a melting point of 142°–143° C.

Example (d)

N-(3′-Hydroxy-2′,2′-dimethylpropyl)-3,4-dihydronaphthalene-1,2-dicarboxylic acid imide 20.0 g (0.1 mol) of 3,4-dihydronaphthalene-1,2-dicarboxylic acid anhydride and 10.3 g (0.1 mol) of 2,2-dimethyl-3-aminopropanol are dissolved in 60 ml of toluene and the solution is refluxed for 2 hours, the water formed being separated off by means of a water separator. After the reaction has ended, the reaction mixture is concentrated to dryness in vacuo at 60° C. The residue is recrystallised from ethanol. This yields 25.1 g (87.9% of theory) of N-(3′-hydroxy-2′,2′-dimethylpropyl)-3,4-dihydronaphthalene-1,2-dicarboxylic acid imide.

Example (e)

N-(3'-Hydroxy-2',2'-dimethylpropyl)-6,7-dihydro-5H-benzocycloheptene-8,9-dicarboxylic acid imide 21.4 g (0.1 mol) of 6,7-dihydro-5H-benzocycloheptene-8,9-dicarboxylic acid anhydride and 10.3 g (0.1 mol) of 2,2-dimethyl-3-aminopropanol are dissolved in 60 ml of toluene and the solution is refluxed for 1 hour, the water formed being separated off by means of a water separator downstream of the reaction vessel. After cooling to room temperature, the crystals which have precipitated out are filtered off. This yields 28.9 g (96.6% of theory) of N-(3'-hydroxy-2',2'-dimethylpropyl)-6,7-dihydro-5H-benzocycloheptene-8,9-dicarboxylic acid imide.

Example (f)

N-(2'-Methacryloyloxyethyl)-3,4-dihydronaphthalene-1,2-dicarboxylic acid imide 24.3 g (0.1 mol) of N-(2'-hydroxyethyl)-3,4-dihydronaphthalene-1,2-dicarboxylic acid immide, 12.9 g (0.15 mol) of methacrylic acid, 1.6 ml of concentrated sulphiric acid and 1.0 g of 2,6-di-tert.-butyl-p-cresol are dissolved in toluene and the solution is refluxed for 2 hours, the water formed being separated off by means of a water separator downstream of the reaction vessel. The reaction solution is then cooled to room temperature, 5.52 g (0.075 mol) of calcium hydroxide are added and the mixture is stirred thoroughly for 5 minutes. After filtering, the filtrate is concentrated to dryness in vacuo at 60° C. This yields 28.8 g (95.7% of theory) of N-(2'-methacryloyloxyethyl)-3,4-dihydronaphthalene-1,2-dicarboxylic acid imide.

Example (g)

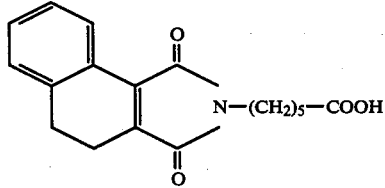

A solution of 20 g (0.1 mol) of 3,4-dihydronaphthalene-1,2-dicarboxylic acid anhydride and 13.1 g (0.1 mol) of 6-aminocaproic acid in 130 ml of acetic acid is refluxed for 6 hours. The reaction solution is evaporated. The yellow solid product, which has a melting point of 109°–111° C., is recrystallised from 100 ml of carbon tetrachloride.

Yield: 23.9 g (76.2% of theory) melting point 108°–111° C., crystals.

Analysis: calculated: C 69.00%, H 6.11%, N 4.47%; found: C 68.78%, H 6.12%, N 4.69%.

NMR spectrum (DMSOCH$_6$): =7.9 [1H]; 7.15 [3H]; 3.40 [2H, t]; 3.00 [2H, t]; 2.60 [2H, t]; 2.20 [2H, t]; 1.8–1.1 [6H, Mp].

Example (h)

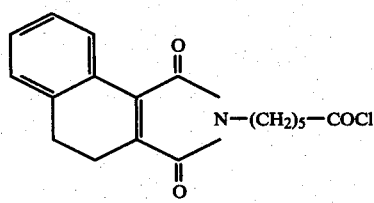

2 g (0.0062 mol) of the N-(caproic acid)-3,4-dihydronaphthalene-1,2-dicarboximide obtained according to Example (g) and 0.51 ml (0.007mol) of thionyl chloride are dissolved in 10 ml of methylene chloride and the solution is stirred at room temperature for 24 hours. It is then refluxed for 3 hours and evaporated to dryness. This yields 2 g (94.4% of theory) of an oily product which crystallises after 24 hours. Melting point 65°–67° C.

Analysis: calculated: C 65.16%, H 5.47%, N 4.22%, Cl 10.69%; found: C 65.34%, H 5.54%, N 4.31%, Cl 9.51%.

Example (i)

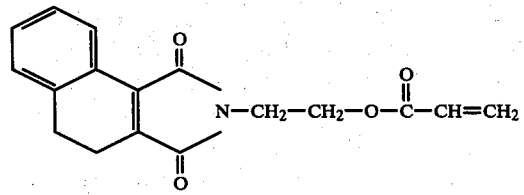

A solution of 60.82 g of N-(2'-hydroxyethyl)-3,4-dihydronaphthalene-1,2-dicarboxylic acid imide, 24.51 g (0.34 mol) of acrylic acid and 5 ml of chemically pure H$_2$SO$_4$ in 240 ml of toluene, with the addition of 1.2 g of Cu-II acetate, is refluxed for 1½ hours, the water formed (4.5 ml) being separated off by means of a water separator.

The solution, which has cooled to room temperature, is neutralised with 300 ml of 8% NaHCO$_3$ solution. The aqueous phase is extracted with 2×400 ml of toluene. The organic phase is washed with 100 ml of water, dried and evaporated.

Yield: 53.3 g=71.65%, melting point 86°–89° C.

Analysis: calculated: C 68.68%, H 5.09%, N 4.71%; found: C 68.36%, H 5.1%, N 4.74%.

Example (j)

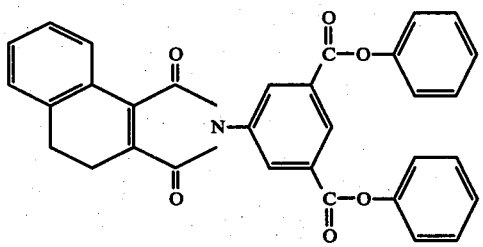

9.5 g (0.100 mol) of phenol are dissolved in 500 ml of anhydrous toluene and the solution is refluxed. 55 ml of toluene are distilled off (drying of the phenol) and the solution is cooled to room temperature. At room temperature, 20 g (0.05 mol) of N-(4'-isophthalic acid dichloride)-3,4-dihydronaphthalene-1,2-dicarboximide and 10.36g of triethylamine are added and the mixture is stirred for 50 hours at room temperature. The thick suspension is diluted with 200 ml of toluene and filtered with suction. The yellow filtrate is evaporated and the residue is recrystallised from 70 ml of ethylene glycol monomethyl ether.

Yield: 9 g=35% of theory, melting point 205°-208° C.

Analysis: calculated: C 74.56%, H 4.11%, N 2.72%; found: C 74.41%, H 3.95%, N 2.78%.

Example (k)

16.25 g (0.077 mol) of disodium 3-aminoisophthalate, 150 ml of water, 150 ml of dimethylacetamide and 16.48 g (0.077 mol) of 6,7-dihydro-5H-benzocycloheptene-8,9-dicarboxylic acid anhydride are warmed to 100°, with stirring. The clear solution is stirred at 100° for 1 hour. After cooling to 80°, 85 ml of 2 N HCl solution are added dropwise. The yellow suspension, which has been cooled to room temperature, is filtered with suction and the material on the suction filter is washed with 100 ml of cold water and dried in vacuo at 100° for 12 hours. This yields 28 g (96.7% of theory) of N-(3-isophthaloyldicarboxylic acid)-6,7-dihydro-5H-benzocycloheptene-8,9-dicarboxylic acid imide which has the following elementary analysis for the empirical formula $C_{21}H_{15}NO_6$: calculated: C 66.84%, H 4.01%, N 3.71%; found: C 65.8%, H 3.97%, N 3.60%.

Example (l)

5 g (0.013 mol) of N-(3-isophthaloyldicarboxylic acid)-6,7-dihydro-5H-benzocycloheptene-8,9-dicarboxylic acid imide, 2 drops of dimethylformamide and 26 ml of thionyl chloride are refluxed for 30 minutes. The red solution is evaporated and the red crystalline product is recrystallised from 30 ml of dry toluene. This yields 2.4 g (43.7% of theory) of N-(3-isophthaloyldicarboxylic acid chloride)-6,7-dihydro-5H-benzocycloheptene-8,9-dicarboxylic acid imide which has a melting point of 178°-181° and the following elementary analysis, calculated for the empirical formula $C_{21}H_{13}NO_4Cl_2$: calculated: C 60.89%, H 3.17%, N 3.38%, Cl 17.12%; found: C 60.75%, H 3.21%, N 3.59%, Cl 16.9%.

What is claimed is:

1. A photo-crosslinkable polymer, which has an average molecular weight between 1,000 and 50,000, as measured by inherent viscosity on a 0.5% by weight solution in cyclohexanone at 20° C. and which has side imidyl groups of the formula (I)

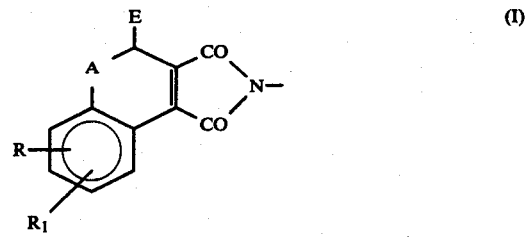

in which R and $R_1$ independently of one another are hydrogen, halogen, alkyl having 1–4 C atoms or methoxy, A is —$CH_2$—, —$CH_2CH_2$— or —$OCH_2$— with the oxygen atom bonded to the aromatic ring and E is hydrogen, or A is —O— and E is —$CH_3$, the proportion of imidyl groups of the formula I being at least 5 percent, based on the number of recurring structural elements in the polymer, said polymer being a polyester which is a homopolycondensation product or a copolycondensation product of a dicarboxylic acid or ester forming derivative thereof with a dihydroxy or diglycidyl compound, wherein said polymer comprises (a) from 5 to 100 percent, based on recurring structural elements in the polymer chain, of molecular chain members of the formula XV

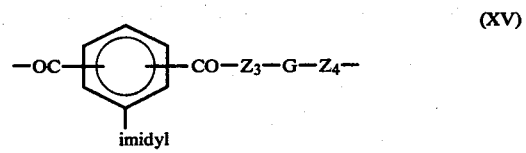

in which $Z_3$ and $Z_4$ are —O—, and G is an aliphatic radical having at least 2 C atoms or a cycloaliphatic, araliphatic, carbocyclicaromatic or heterocyclic-aromatic radical, or $Z_3$—G—$Z_4$— is a grouping of the formulae

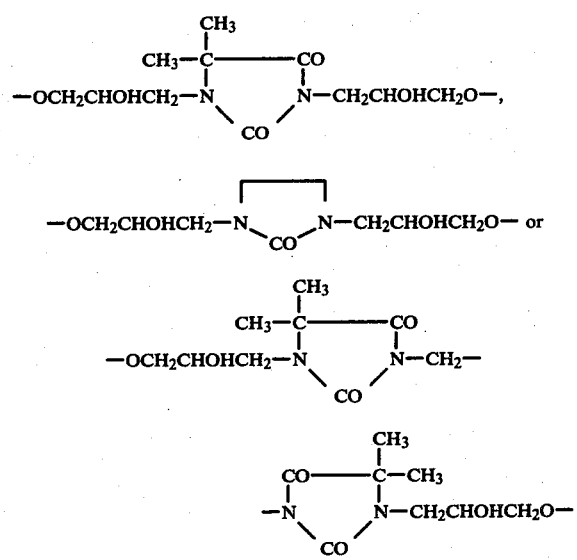

the two carbonyl groups in the formula XV being bonded to the benzene ring in the meta- or para-position relative to one another, and (b) from 95 to 0 percent, based on recurring structural elements in the polymer chain, of structural elements of the formula XVII

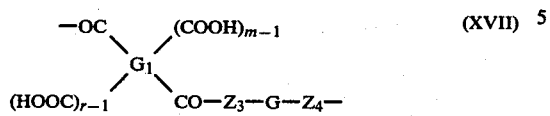
(XVII)

in which $Z_3$, $Z_4$ and G are as defined under formula XV, m and r are each the number 1, and $G_1$ is an aliphatic radical having at least 2 C atoms or a cycloaliphatic, araliphatic, carbocyclic-aromatic or heterocyclic-aromatic radical.

2. A polymer according to claim 1, which comprises
(a) from 5 to 100 percent, based on recurring structural elements in the polymer chain, of molecular chain members of the formula XVa

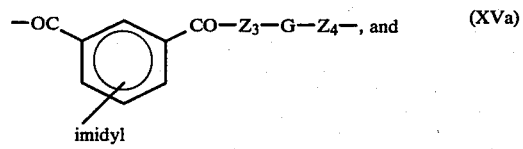
(XVa)

(b) from 95 to 0 percent, based on recurring structural elements in the polymer chain, of molecular chain members of the formula XVIIa

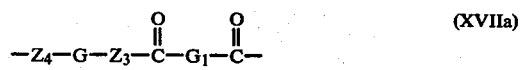
(XVIIa)

in which formula imidyl is a radical of the formula I in which R and $R_1$ are each hydrogen, A is —$CH_2$—, —$CH_2CH_2$— or —$OCH_2$— with the oxygen atom bonded to the aromatic ring and E is hydrogen, and $Z_3$ and $Z_4$ are each —O—, G is alkylene having 2–12 C atoms or arylene having 6–10 C atoms, or arylene substituted by halogen atoms or by alkyl groups having 1–4 C atoms, and $G_1$ is alkylene having 2–10 C atoms or 1,3- or 1,4-phenylene.

3. A homopolymer according to claim 1 which has the recurring structural element

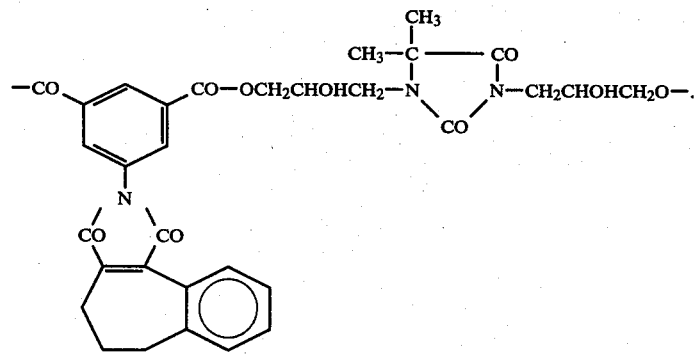

4. A polymer according to claim 1, which contains imidyl groups of the formula I in which R and $R_1$ are each hydrogen, A is —$CH_2$—, —$CH_2CH_2$— or —$OCH_2$— with the oxygen atom bonded to the aromatic ring and E is hydrogen.

5. A polymer according to claim 1, in which the proportion of imidyl groups of the formula I is 20–100 percent, based on the number of recurring structural elements in the polymer.

* * * * *